United States Patent [19]

Ueyama et al.

[11] Patent Number: 5,707,845
[45] Date of Patent: Jan. 13, 1998

[54] ORGANIC ELECTRONIC ELEMENT FROM MODIFIED CYTOCHROME C551 AND CYTOCHROME C552

[75] Inventors: Satoshi Ueyama; Satoru Isoda; Ken-ichi Inatomi; Hiroaki Kawakubo, all of Amagasaki, Japan

[73] Assignee: Mitsubishi Denki Kabushiki Kaisha, Tokyo, Japan

[21] Appl. No.: 544,608

[22] Filed: Oct. 18, 1995

Related U.S. Application Data

[60] Continuation of Ser. No. 237,242, May 2, 1994, abandoned, which is a division of Ser. No. 945,155, Sep. 15, 1992, abandoned.

[30] Foreign Application Priority Data

Sep. 17, 1991 [JP] Japan .................. 3-235964

[51] Int. Cl.$^6$ .................. C12N 9/02; H01L 51/00; H02M 7/06
[52] U.S. Cl. .................. 435/189; 257/40; 363/126
[58] Field of Search .................. 435/189; 363/126; 257/40

[56] References Cited

U.S. PATENT DOCUMENTS

| | | | |
|---|---|---|---|
| 4,613,541 | 9/1986 | Isoda | 428/212 |
| 4,764,415 | 8/1988 | Isoda et al. | 428/212 |
| 4,764,416 | 8/1988 | Ueyama et al. | 428/212 |
| 4,820,416 | 4/1989 | Chang et al. | 210/632 |
| 4,965,133 | 10/1990 | Ueyama et al. | 428/411.1 |
| 5,010,451 | 4/1991 | Ueyama et al. | 361/504 |
| 5,171,679 | 12/1992 | Haber et al. | 435/188 |

FOREIGN PATENT DOCUMENTS 63-238166 10/1988 Japan .

OTHER PUBLICATIONS

Yomo et al. (Mar. 1991) *Eur. J. Biochem.*, 196, 343–348.
Kuriyan et al. (1988) *J. Am. Chem. Soc.*, 110, 6261–6263.
Degani et al. (1987) *J. Phys. Chem.*, 91(6), 1285–1289.
Yoma et al., (Sep. 1991) *Eur. J. Biochem.*, 200, 759–766.
Nakamura et al. (1986) *J. Biol. Chem.*, 261(36), 16792–16794.
Yomo et al. (1992) *Eur. J. Biochem.*, 203, 533–542.
Eguchi et al, (1986) *Eur. J. Biochem.*, 155, 415–421.
Baum (1993), *Chem. Eng. News*, 20 (22 Feb.).
Walsh (1979) "Enzymatic Reaction Mechanisms", pp. 432–439, Freeman & Co., San Francisco.
Isoda, S., M. Maeda, H. Miyasaka and N. Matago, Chem. Phys. Lett. 182:379–383 (1991).
Kaiser E.T., Agnew. Chem. Int. Ed. Engl. 27:913–922 (1988).
Isoda et al., "Organic Materials with Anisotropic Electron Transfer" (Abstract of JP63-238166, Okooi) Chemical Abstracts vol. 110 (1989) 59155x.
"Toward Organic Rectifier", R.M. Metzger and C.A. Panetta, Molecular Electronic Devices II, 1987.
"Catalytic Activity of Enzymes Altered at their Active Sites", E.T. Kaiser, Agnew Chem. Int. Ed. Engl. 27, 1988, pp. 913–922.
Y. Degani & A. Heller "Direct Electrical Communication between Chemically Modified Enzymes and Metal Electrodes . . ." J. Am. Chem. Soc. 1988 pp. 2615–2620.

*Primary Examiner*—Jon P. Weber
*Attorney, Agent, or Firm*—Wolf, Greenfield & Sacks, P.C.

[57] ABSTRACT

An organic electronic element material has been produced by modifying cytochrome c551 and cytochrome c552 by bonding at least a second electron transfer functional group to an amino acid residue of the cytochrome. The residue for attachment of the additional electron transfer groups could be introduced by genetic engineering or generated by chemical modification. A plurality of different electron transfer groups can be introduced to provide different redox potentials. Electron transfer can be caused to occur between the functional groups on the modified cytochromes to provide a desired electric property such as rectification, or switching in response to light.

4 Claims, 4 Drawing Sheets

FIGURE 8
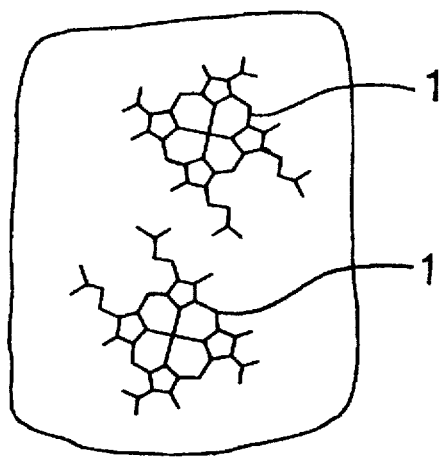
FIGURE 9(a)
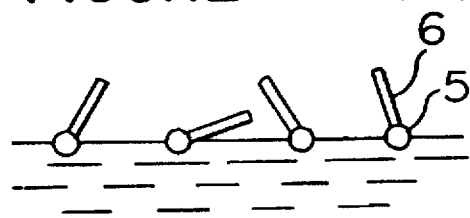
FIGURE 9(b)
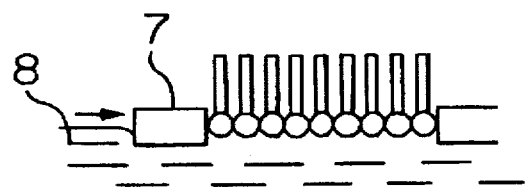
FIGURE 9(c)   FIGURE 9(d)
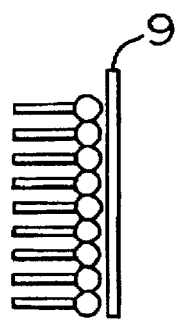 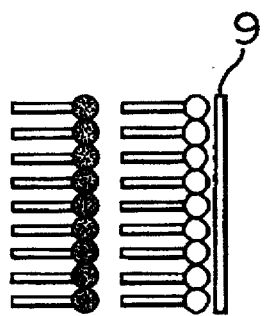

ORGANIC ELECTRONIC ELEMENT FROM MODIFIED CYTOCHROME C551 AND CYTOCHROME C552

This application is a Continuation of application Ser. No. 08/237,242, filed May 2, 1994, now abandoned, which is a division of Ser. No. 07/945,155, filed Sep. 15, 1992 now abandoned.

BACKGROUND OF THE INVENTION

FIELD OF THE INVENTION

The present invention relates to an organic electronic element material used for an electronic device. Particularly, the present invention relates to an organic electronic element material usable for an ultra-fine switching element or rectifying element workable at a high speed, which can be integrated at an ultra-high density by controlling the level or orientation of electric conduction at an ultra-fine size (from several tens and several hundreds Å) of molecular level by means of a functional group having an electron transfer function.

DISCUSSION OF BACKGROUND

Heretofore, conventional examples of an organic electronic element material include thin film materials formed by sputtering method, vacuum deposition method, electrolytic polymerization method, Langmuir-Blodgett's technique (LB method) and casting method described in "Organic Electronics Materials" (edited by Taniguchi, published by Science Forum, page 166). FIGS. 9(a–d) illustrate process steps of LB method. In the figures, 5 is a functional group; 6 is an alkyl chain; 7 is a compressive bar; 8 is water; and 9 is an electrode.

The LB method is explained hereinafter. A material used is a low molecule (hereinafter referred to as "LB molecule") containing a functional group having an alkyl chain attached. This LB molecule is dissolved in an organic solvent such as chloroform, and the solution is dropped on the surface of water. When the organic solvent is removed by evaporation, a monomolecular film comprising LB molecules only remains on the surface of water (FIG. 9a). Thereafter, when the monomolecular film is compressed by a compressive bar, the LB molecules in the monomolecular film are aligned in a constant direction (FIG. 9b). Thereafter, when a glass electrode having a metal such as aluminum vapor-deposited thereon is vertically immersed in water and is then pulled up, the monomolecular film is transferred onto the electrode and the monomolecular film comprising LB molecules is formed on the electrode (FIG. 9c). This film is called as a "Langmuir-Blodgett's film" (LB film). Bonding between two types of functional groups can be made by accumulating a monomolecular film comprising the second type molecules on a monomolecular film comprising the first type molecules (FIG. 9d).

In an electronic element using the conventional organic electronic element material, functional groups are in direct contact with each other or very close to each other in a film comprising the same type molecules in the same manner as in the above-mentioned electronic element using an LB film. Therefore, since it is impossible to control the direction of electron transfer at the molecular level, it is impossible to make one element by one molecule and it is difficult to integrate an electronic element at a high density.

The same disadvantages are provided also by the conventional organic electronic elements prepared by casting method, electrolytic polymerization method, vacuum deposition method, sputtering method and the like. According to these conventional methods, it is very difficult to control the orientation and the distance between functional groups which greatly contribute to electron transfer.

SUMMARY OF THE INVENTION

An object of the present invention is to solve the above-mentioned problems of the conventional methods and to provide an ultra-fine organic electronic element material usable for an electronic element such as a rectifying element and a switching element, which can be integrated at an ultra-high density since one molecule works as one element and the orientation and the distance between functional groups can be controlled.

Thus, the present invention provides an organic electronic element material which comprises a naturally occurring biopolymer or a biopolymer modified chemically and/or via genetic engineering, said biopolymer being provided with a functional group having an electron transfer function such that the electronic element material comprises plural functional groups, so that a desired electric property can be provided by electron transfer caused between the functional groups.

The present invention further provides an organic electronic element material which comprises a naturally occurring biopolymer or a biopolymer modified chemically and/or via genetic engineering, said biopolymer being bonded to a naturally occurring biopolymer having a functional group having an electron transfer function or a biopolymer modified chemically and/or via genetic engineering such that the electronic element material comprises plural functional groups in a molecule, so that a desired electric property can be provided by electron transfer caused between the functional groups.

BRIEF DESCRIPTION OF THE DRAWINGS

FIG. 8 is a drawing illustrating an organic electronic element material prepared in Example 4 of the present invention; and FIGS. 9A–9D are drawings illustrating the process steps of LB method which is the preparation method of the conventional organic electronic element material;

wherein 1 represents a heme as a functional group, 2 representing a polymer molecule having a heme, 3 representing a flavin mononucleotide as a functional group and 4 representing a polymer molecule having a flavin mononucleotide.

DETAILED DESCRIPTION OF THE PREFERRED EMBODIMENTS

The photosynthetic reaction center protein molecule of photosynthetic bacteria has a functional group having an electron transfer function such as bacteriochlorophyll, bacteriopheophytin and quinones, which are delicately aligned and electrons transfer among functional groups in order. This electron transfer among the functional groups in an ultra-fine space is known to be quantum-mechanical system depending on the distance between the functional groups, the orientation and the energy level. Accordingly, an element having a rectifying function can be obtained by artificially disposing functional groups having an electron transfer function in a predetermined space by taking the energy level, distance and orientation into consideration.

According to the present invention, an organic electronic element material having a desired electric property working as one element per molecule can be provided since functional groups having an electron transfer function can be freely selected and combined so as to control the orientation and the distance between the functional groups.

The organic electronic element material of the present invention can retain plural functional groups having an electron transfer function in a molecule by modifying, reforming or bonding a molecule.

Figure 1:
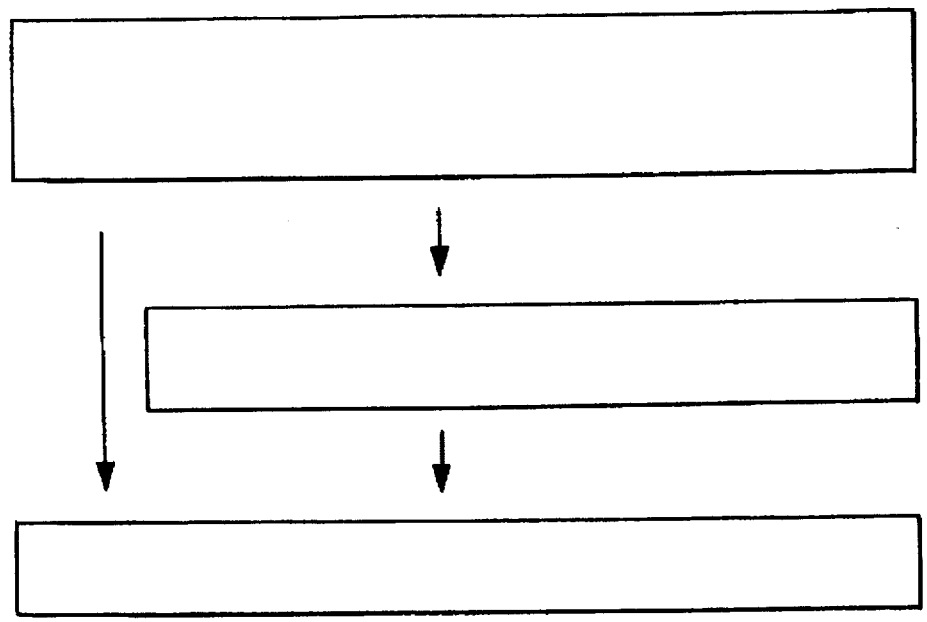
FIG. 1 is a flow chart illustrating one example of a method for preparing an organic electronic element material of the present invention.
Figure 2:
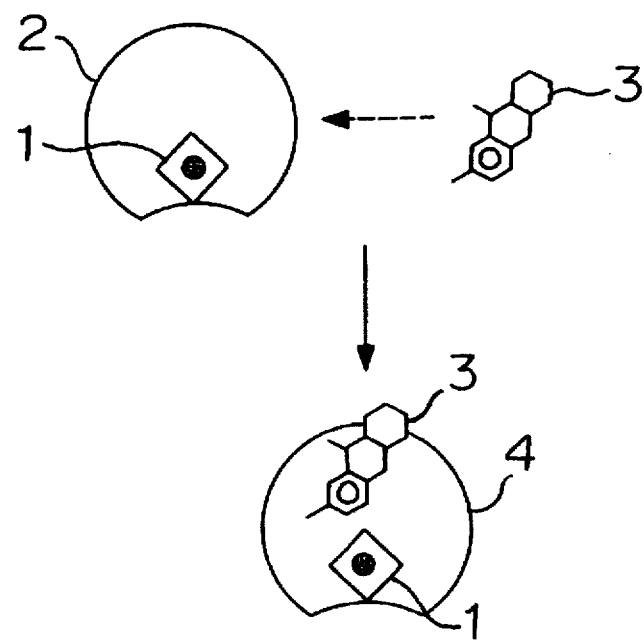
FIG. 2 is a drawing illustrating the preparation method as illustrated in FIG. 1.

As a method for imparting a functional group to protein, there is a method for modifying a protein. For example, according to the Journal of Physical Chemistry (91, 1285, 1987) written by Y. Degani and A. Heller, ferrocene as a functional group is bonded to glucose oxidase as an oxidoreductase by means of carbodiimide. In order to further increase the location-specificity, an amino acid residue at the desired position of protein may be (mutated) into an easily modifiable residue such as histidine or cysteine by means of the site-specific mutagenesis technique of genetic engineering method, and the modification may thereafter be conducted. A method for preparing an electronic element material by bonding a functional group to a polymer molecule having a functional group or a polymer molecule having no functional group as mentioned above, is illustrated in FIGS. 1 and 2. According to this method, for example, as illustrated in FIG. 2, a part of a polymer molecule 2 having a heme 1 as a functional group, which is an example of the starting material, is mutated, and a flavin mononucleotide 3 is then bonded thereto, thereby providing an electronic element material 4 having the heme and the flavin mononucleotide as functional groups.

As another method, it is known to conduct chimera-modification of a protein. This method comprises bonding at least two genes coding at least a part of plural proteins to realize one protein molecule by means of microorganism. According to this method, it is possible to form a chimera molecule having at least 2 types of functional groups in a molecule by conducting chimera-modification of at least two types of proteins.

Figure 3:
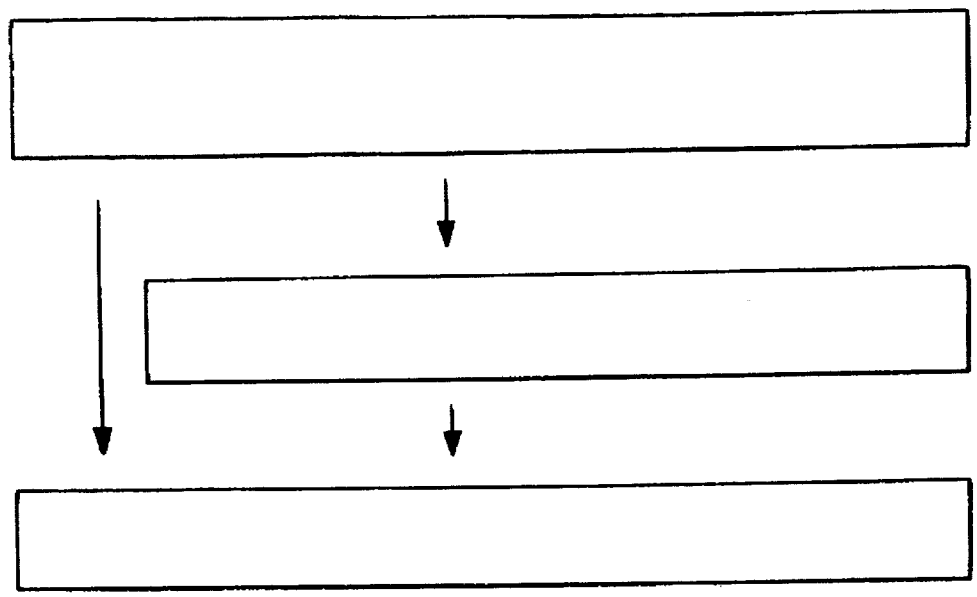
FIG. 3 is a flow chart illustrating another example of a method for preparing an organic electronic element material of the present invention.
Figure 4:
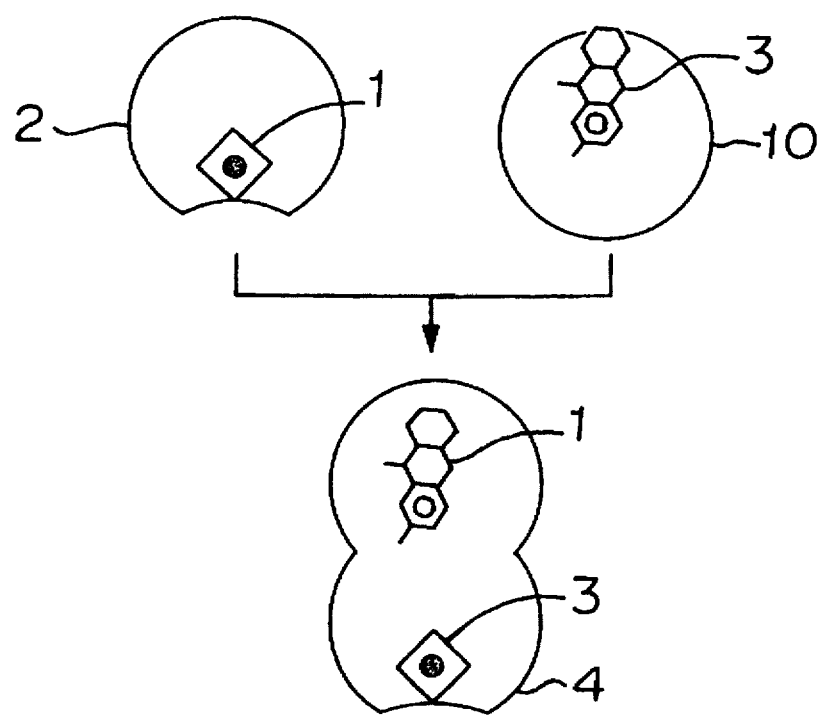
FIG. 4 is a drawing illustrating the preparation method as illustrated in FIG. 3.

A method for preparing an electronic element material by bonding two types of polymer molecules having these functional groups is illustrated in FIGS. 3 and 4. According to this method, for example, as illustrated in FIG. 4, parts of two types of polymer molecules such as a polymer molecule 2 having a heme 1 as a functional group and a polymer molecule 10 having a flavin mononucleotide 3, which are one example of the starting materials, are reformed, and the reformed materials are then bonded, thereby providing an electronic element material 4 having the heme and the flavin mononucleotide as functional groups.

The present invention is further illustrated by the following Examples, but should not be limited thereto.

EXAMPLE 1

Cytochrome c551 of *Pseudomonas aeruginosa* is an electron transfer protein having one heme of metalloporphyrin. In this protein, the heme is one-sidedly omnipresent. Accordingly, lysine 76 which is an amino acid residue at the part where the heme is not present, is reformed into cysteine by site-specific mutagenesis technique. Thereafter, an organic electronic element material, i.e. a polymer molecule having two functional groups of the metalloporphyrin heme and the flavin mononucleotide, can be obtained by treating with a brominated flavin mononucleotide (isoalloxazine derivative), hydrogen at the 8α-position of which is substituted with bromine.

Figure 5:
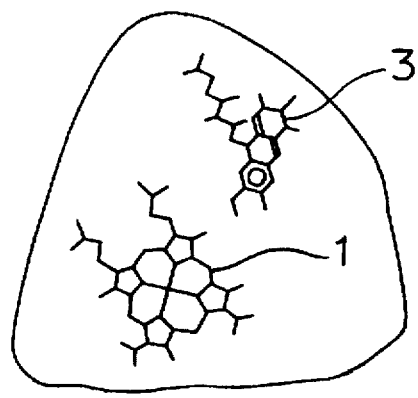
FIG. 5 is a drawing illustrating an organic electronic element material prepared in Example 1 of the present invention.
Figure 6:
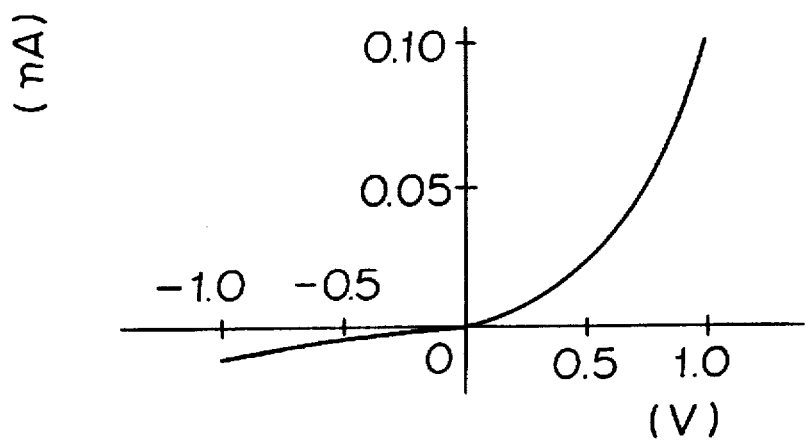
FIG. 6 is an electric current-voltage property graph illustrating a rectifying function of the organic electronic element material prepared in Example 1 of the present invention.

FIG. 5 illustrates the polymer molecule thus obtained. The energy level of the heme 1 is lower than the energy level of the flavin mononucleotide 3, and accordingly electrons flow from the flavin mononucleotide 3 to the heme 1 in one direction. FIG. 6 shows the electric current-voltage property of molecular level measured by absorbing getting the above prepared polymer molecule onto a gold monocrystal electrode and then subjecting to scanning tunneling spectrocopy (STS), and its rectifying function was recognized. Thus, the electronic element material of this example was recognized to be usable as one rectifying element per molecule.

Figure 7:
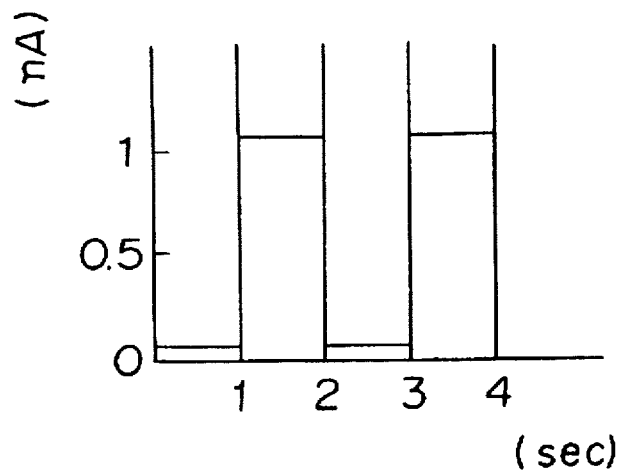
FIG. 7 is a property graph illustrating an electric current change caused by light-irradiating on the organic electronic element material prepared in Example 1 of the present invention.

FIG. 7 shows the change in electric current caused when this polymer molecule is irradiated with light having a wavelength of 450 nm (light) and when this polymer molecule is not irradiated with light (dark). It is evident from this figure that the electric current value increases by irradiation with light. This is because carriers (electron and positive hole) which participate in electron transfer are formed when the flavin mononucleotide in the polymer molecule is excited with light. The same effect could be observed when using light having other wavelength. It was observed that the change in the electric current value was caused also by the change in electric field or magnetic field other than light. This is due to the change in the energy level of electrons in the flavin mononucleotide and the heme caused by the change in the electric or magnetic field. This electronic element material was recognized to be usable as a switching element since the electric current value varied by light, electric field and magnetic field.

EXAMPLE 2

The above Example showed a case wherein lysine 76 was substituted with cysteine, but the same result could be obtained by reformation at another part such as tryptophan 77. Also, a functional group may be modified after being substituted with histidine in place of cysteine.

EXAMPLE 3

Cytochrome c552 of *Hydrogenobacter thermophilus* as a hydrogen bacteria is an electron transfer protein similar to Cytochrome c551, but a polymer molecule having two functional groups of a heme and a flavin mononucleotide was obtained by using this material and substituting lysine 70 with cysteine in place of lysine 76, in the same manner as above. It was recognized to be usable as a rectifying element and a switching element. The same effect could be achieved by reformation at another position such as tryptophan 75 in place of lysine 70.

In the above examples, a flavin mononucleotide was used as a modifying functional group, but there can be used other functional groups having an electron transfer function such as an organic metal complex including metalloporphyrin, metallophthalocyanine and ferrocene, porphyrin, phthalocyanine, quinone, isoalloxazine, pyridine nucleotide, viologen or their derivatives, an organic charge transfer complex including TCNQ (tetracyanoquinodimethane), a metal atom, a metal ion and an iron-sulfur cluster.

Also, a functional group may be modified by using a reagent such as carbodiimide without substituting an amino acid residue, by synthesizing a derivative having a functional group easily modifiable or by utilizing the mutual action of an aromatic ring, a hydrogen bonding or an ion bonding.

A functional group may be bonded to other electron transfer proteins such as cytochromes (a, b, b1, b2, b5, b562, c, c', c2, c3, c4, c5, c6, c7, c550, c551, c552, c553, f, h and o), flavodoxin, ferredoxin, rubredoxin, thioredoxin, plastocyanin, azurin, and oxidoreductases such as oxidases including cytochrome c oxidase and glucose oxidase, dehydrogenases including alcohol dehydrogenase and lactic acid dehydrogenase, reductases, hydrogenases, peroxidases, hydroperoxidases and oxigenases.

When a functional group is imparted to these polypeptide proteins by modification, if cysteine or histidine is already contained therein, it may be utilized. In order to control the distance and the orientation among functional groups, an amino acid residue as a part of protein may be substituted with other naturally occurring or synthetic amino acid residues, deleted, imparted with other naturally occurring or synthetic amino acid residues or modified with a molecule such as saccharides. Furthermore, plural functional groups may be bonded to polypeptides such as a protein having no functional group.

EXAMPLE 4

This Example illustrates a case wherein polymer molecules are bonded to provide an organic electronic element material having plural functional groups. DNA coding amino acid residues (the first 70 residues from the N terminal) which contain amino acid residues bonded with a heme of the above-mentioned cytochrome c551, was bonded with DNA coding amino acid residues (the first 90 residues from the N terminal) which contain amino acid residues bonded with a heme of cytochrome c (another electron transfer protein having a heme), in a plasmid, and the bonded material was introduced in *Escherichia coli* to realize the desired polymer molecule. The polymer molecule thus realized is illustrated by FIG. 8. It was recognized that the polymer molecule thus obtained has a rectifying function and a switching function in the same manner as the organic electronic element materials of the above Examples.

In Example 4, cytochrome c551 and cytochrome c were used, but the above-mentioned other electron transfer proteins or oxidoreductases may be used in place of them. Also, the amino acid residue number used may be other numbers. The realization may be conducted by using other microorganisms, and the realization may be conducted in vitro by using an extracted liquor of the microorganism used or an enzyme obtained from the extracted liquor. Also, proteins may be directly peptide-bonded. Also, a polymer molecule having a functional group other than proteins may be bonded.

As mentioned above, according to the present invention, there can be obtained an organic electronic element material usable as an electron element such as an ultra-fine rectifying element and a switching element integratable at an ultra-high density, which works as one element per molecule. Thus, the above effect can be achieved by providing an organic electronic element material which comprises a naturally occurring biopolymer or a biopolymer modified chemically and/or via genetic engineering, (i) said biopolymer having a functional group having an electron transfer function bonded thereto such that the electronic element material comprises plural functional groups, so that a desired electric property can be provided by electron transfer caused between the functional groups, or (ii) said biopolymer being bonded with a naturally occurring biopolymer having a functional group having an electron transfer function or a biopolymer modified chemically and/or via genetic engineering such that the electronic element material comprises plural functional groups in a molecule, so that a desired electric property can be provided by electron transfer caused between the functional groups.

What is claimed is:

1. An electronic element comprising:
   an electrode and a monomolecular film, wherein
   said film is absorbed to said electrode and comprises a modified protein,
   said modified protein comprising a cytochrome which has a first electron transfer functional group having a first redox potential, wherein said cytochrome has been modified by covalently bonding a second electron transfer functional group which has a second redox potential to an amino acid residue of said cytochrome, selected from the group consisting of Lys 76 modified to Cys 76 and Trp 77 modified to Cys 77 said second electron transfer group being located so as to allow electron transfer between said first and second electron transfer functional groups, wherein said cytochrome is cytochrome c551, and
   wherein said redox potential of said first electron transfer functional group is different from said redox potential of said second electron transfer functional group.

2. An electronic element comprising:
   an electrode and a monomolecular film, wherein
   said film is absorbed to said electrode and comprises a modified protein,
   said modified protein comprising a cytochrome which has a first electron transfer functional group having a first redox potential, wherein said cytochrome has been modified by covalently bonding a second electron transfer functional group which has a second redox potential to an amino acid residue of said cytochrome selected from the group consisting of Lys 70 modified to Cys 70 and Trp 75 modified to Cys 75, said second electron transfer group being located so as to allow electron transfer between said first and second electron transfer functional groups, wherein said cytochrome is cytochrome c552, and
   wherein said redox potential of said first electron transfer functional group is different from said redox potential of said second electron transfer functional group.

3. An electronic element as in claims 1 or 2 wherein said first and second electron transfer functional groups are selected from the group consisting of heme and flavin.

4. An electron element as in claims 1 or 2 wherein said second electron transfer functional group is selected from the group consisting of metalloporphyrin, metallophthalocyanine, ferrocene, porphyrin, phthalocyanine, quinone, isoalloxazine, pyridine nucleotide, viologen, tetracyanoquinodimethane, a metal atom having electron transfer capability, a metal ion which transfers electrons and iron sulfur cluster.

* * * * *